(12) United States Patent
Fukuyama et al.

(10) Patent No.: US 8,917,081 B2
(45) Date of Patent: Dec. 23, 2014

(54) CURRENT DETECTION DEVICE AND METHOD FOR PRODUCING SAME

(75) Inventors: Susumu Fukuyama, Yokkaichi (JP); Hirokatsu Nakajima, Yokkaichi (JP)

(73) Assignees: Autonetworks Technologies, Ltd, Mie (JP); Sumitomo Wiring Systems, Ltd, Mie (JP); Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 13/809,171

(22) PCT Filed: Aug. 25, 2011

(86) PCT No.: PCT/JP2011/069124
§ 371 (c)(1),
(2), (4) Date: Jan. 9, 2013

(87) PCT Pub. No.: WO2012/026510
PCT Pub. Date: Mar. 1, 2012

(65) Prior Publication Data
US 2013/0113463 A1    May 9, 2013

(30) Foreign Application Priority Data

Aug. 26, 2010  (JP) ................. 2010-189305

(51) Int. Cl.
  *G01R 19/00*  (2006.01)
  *G01R 15/20*  (2006.01)
  *G01R 3/00*   (2006.01)
  *G01R 31/36*  (2006.01)

(52) U.S. Cl.
  CPC ........ *G01R 19/0092* (2013.01); *G01R 31/3696* (2013.01); *G01R 15/207* (2013.01); *G01R 3/00* (2013.01); *G01R 15/202* (2013.01)
  USPC ................ 324/117 R; 324/117 H; 324/127

(58) Field of Classification Search
  None
  See application file for complete search history.

(56) References Cited

U.S. PATENT DOCUMENTS 5,552,700 A * 9/1996 Tanabe et al. ............. 324/117 H
6,008,634 A   12/1999 Murofushi et al.
(Continued)

FOREIGN PATENT DOCUMENTS

DE  10 2004 058 452 A1  6/2006
JP       A-10-104279    4/1998
(Continued)

OTHER PUBLICATIONS

International Search Report issued in International Application No. PCT/JP2011/069124 dated Nov. 15, 2011.

(Continued)

*Primary Examiner* — Melissa Koval
*Assistant Examiner* — Stephen G Armstrong
(74) *Attorney, Agent, or Firm* — Oliff PLC

(57) ABSTRACT

A current detection device includes a bus bar for current detection. The bus bar for current detection is constituted by a conductor provided with a first portion penetrating through a hollow portion of a magnetic material core in a first direction in which a current passes and plate-shaped second portions each linked to both sides in the first direction with respect to the first portion, the bus bar for current detection formed such that a width of the second portion is greater than a maximum width of the hollow portion of the magnetic material core and a minimum width of a contour of a section in the first portion is greater than a thickness of the second portion.

4 Claims, 7 Drawing Sheets

(56) References Cited

U.S. PATENT DOCUMENTS

| | | |
|---|---|---|
| 7,692,526 B2 * | 4/2010 | Hundt .......................... 336/192 |
| 8,493,165 B2 * | 7/2013 | Misaki ......................... 335/219 |
| 2006/0119343 A1 | 6/2006 | Saito et al. |

FOREIGN PATENT DOCUMENTS

| | | |
|---|---|---|
| JP | A-2003-45231 | 2/2003 |
| JP | A-2003-124045 | 4/2003 |
| JP | A-2006-166528 | 6/2006 |
| JP | A-2009-58451 | 3/2009 |
| WO | WO 2011049161 A1 * | 4/2011 |

OTHER PUBLICATIONS

Sep. 10, 2014 Office Action issued in German Patent Application No. 11 2011 102 819.9 (with translation).

* cited by examiner

CURRENT DETECTION DEVICE AND METHOD FOR PRODUCING SAME

TECHNICAL FIELD

The present invention relates to a current detection device for detecting a current flowing to a bus bar and a method for producing the same.

BACKGROUND ART

In many cases, a vehicle such as a hybrid car or an electric car is provided with a current detection device for detecting a current flowing to a bus bar connected to a battery. Moreover, in some cases, a current detection device of a magnetic proportion type or a current detection device of a magnetic balance type is employed as the current detection device.

The current detection device of the magnetic proportion type or the magnetic balance type includes a magnetic material core and a magneto-electric converting element as described in Patent Documents 1, 2, and 3, for example. The magnetic material core is a substantially ring-shaped magnetic body that has both ends opposed to each other across a gap portion and is continuously formed around a hollow portion through which a bus bar penetrates. The hollow portion of the magnetic body is a space through which a current to be detected passes (space for detecting current).

Furthermore, the magneto-electric converting element is disposed in the gap portion of the magnetic material core, and detects a magnetic flux which is varied depending on a current flowing through the bus bar provided to penetrate through the hollow portion and outputs a detecting signal of the magnetic flux as an electric signal. For the magneto-electric converting element, a Hall element is usually employed.

PRIOR ART DOCUMENTS

Patent Documents

Patent Document 1: Japanese Patent Application Laid-Open No. 10-104279 (1998)
Patent Document 2: Japanese Patent Application Laid-Open No. 2006-166528
Patent Document 3: Japanese Patent Application Laid-Open No. 2009-58451

SUMMARY OF INVENTION

Problems to be Solved by the Invention

In the conventional current detection device, a plate-shaped bus bar is inserted through a hollow portion of a magnetic material core, therefore the magnetic material core is required to be formed into such a size that a maximum width (a diameter) of the hollow portion is greater than a width of the bus bar. On the other hand, in an electric car, a hybrid car, or the like, a wide bus bar has been employed in order to prevent excessive heat generation of the bus bar with an increase in current flowing to the bus bar.

Accordingly, the conventional current detection device has a problem in that it requires a larger magnetic material core which is proportional to the width of the bus bar with an increase in width of the bus bar and an installation space for the device is therefore enlarged. Particularly, in the case where the magnetic material core has a circular shape, an elliptical shape, or a rectangular angular shape in which a ratio of a longitudinal dimension to a horizontal dimension is one or approximates to one, a wasteful space in the hollow portion of the magnetic material core is increased as the width of the bus bar increases. Moreover, when a bus bar is employed in which only a portion to be disposed in the hollow portion of the magnetic material core is constricted, there is a problem in that the constricted portion excessively generates a heat.

An object of the present invention is to provide a current detection device for detecting a current flowing to a bus bar in which a comparatively small magnetic material core is employed to enable a size of the device to be reduced in a relationship with a width of the bus bar, and furthermore, excessive heat generation of the bus bar can be prevented.

Means for Solving the Problem

A current detection device according to the present invention is a device that detects a current flowing to a bus bar, and includes the following components.

(1) A first component is a magnetic material core having both ends opposed to each other across a gap portion and continuously formed around a hollow portion.

(2) A second component is a magneto-electric converting element disposed in the gap portion for detecting a magnetic flux to be varied depending on a current passing through the hollow portion.

(3) A third component is a bus bar for current detection constituted by a conductor provided with a first portion penetrating through the hollow portion of the magnetic material core in a current passing direction and plate-shaped second portions each linked to both sides in the current passing direction with respect to the first portion, and formed such that a width of the second portion is greater than a maximum width of the hollow portion and a minimum width of a contour of a section in the first portion is greater than a thickness of the second portion.

Moreover, in the current detection device according to the present invention, the bus bar for current detection may have a structure described in the following (3-1) or (3-2).

(3-1) The bus bar for current detection is a member having a structure in which both end portions of a tubular metal member are crushed into a plate shape, wherein the both end portions crushed into the plate shape constitute the second portions and a portion provided therebetween constitutes the first portion.

(3-2) The bus bar for current detection is a member having a structure in which a part of a plate-shaped metal member is folded back along cuts formed on both sides thereof, wherein a fold-back portion constitutes the first portion and portions on both sides of the fold-back portion constitute the second portions.

Moreover, in the bus bar for current detection having the structure described in (3-2), the fold-back portion may be formed in a position inclined to a side of one of ends in a width direction of the second portion.

Moreover, in the bus bar for current detection of the current detection device according to the present invention, the minimum width of the contour of the section in the first portion may be formed to be greater than an interval between both ends of the magnetic material core, and a coupling portion to the other bus bar is formed in the second portion.

Moreover, the current detection device according to the present invention may further include the following components.

(4) A fourth component is an insulation housing constituted by an insulator and covering the magnetic material core, the first portion of the bus bar for current detection, and the magneto-electric converting element in a state in which the coupling portion of the bus bar for current detection and a connector electrically connected to the magneto-electric converting element are exposed to an outside, and holding the magnetic material core, the bus bar for current detection penetrating through the hollow portion, and the magneto-electric converting element disposed in the gap portion in a state not making contact with each other.

Moreover, the present invention can also be grasped as a method for producing the current detection device including the bus bar for current detection described in (3-1). In other words, the method for producing the current detection device according to the present invention includes the following steps. A first step is a penetrating step of causing a tubular metal member to penetrate through the hollow portion of the magnetic material core. A second step is a first pressing step of crushing a first end of the tubular metal member into a plate shape. A third step is a second pressing step of crushing a second end of the tubular metal member into the plate shape. The penetrating step is carried out before one or both of the first pressing step and the second pressing step are performed. The first pressing step and the second pressing step may be carried out at the same time after the penetrating step is performed.

Effects of the Invention

In the current detection device according to the present invention, a direction (a current passing direction) in which the bus bar for current detection penetrates through the hollow portion of the magnetic material core will be hereinafter referred to as a first direction. Moreover, a width direction and a thickness direction of the plate-shaped second portions each linked to parts before and after the first portion penetrating through the hollow portion of the magnetic material core in the bus bar for current detection will be referred to as a second direction and a third direction, respectively.

In the bus bar for current detection provided in the current detection device according to the present invention, as compared with the plate-shaped second portions each linked to the parts before and after the first portion, the first portion penetrating through the hollow portion of the magnetic material core is formed to have a maximum width of a contour of a section which is smaller than a width (a maximum width) of the second portion. In other words, a contour shape of the section of the first portion has a constricted shape in the second direction with respect to the second portion. As a result, it is possible to employ a comparatively small magnetic material core in a relationship with the width of the bus bar, and to avoid an increase in size of the whole device including the magnetic material core.

Furthermore, in the bus bar for current detection, the contour shape of the section of a conductor in the first portion is formed to have a minimum width which is greater than a thickness (a minimum width) of the second portion. Consequently, a sectional area of a conductor in the first portion is not considerably reduced as compared with the sectional area of the conductor in the second portion. As a result, it is possible to prevent excessive heat generation in the first portion.

Moreover, if the bus bar for current detection is a member having a structure in which both end portions of the tubular metal member are crushed into a plate shape, it is possible to fabricate the plated-shaped second portions having a greater width than the width of the hollow portion after inserting the tubular metal member into the hollow portion of the magnetic material core. Accordingly, it is possible to easily fabricate a bus bar for current detection in which a width (a diameter) of the section of the tubular first portion is formed to be greater than a height of the gap portion of the magnetic material core.

Furthermore, if the bus bar for current detection is a member having a structure in which a part of the plate-shaped metal member is folded back along cuts formed on both sides thereof, it is possible to easily fabricate the bus bar for current detection. In this case, it is suitable that the fold-back portion be formed in a position inclined toward one of end sides in the width direction of the second portion. In this case, also when the minimum width of the contour of the section in the first portion is formed to be greater than the height of the gap portion of the magnetic material core, the first portion of the bus bar for current detection can be inserted into the hollow portion of the magnetic material core. The details will be described below.

Moreover, in the case where the minimum width of the contour of the section in the first portion is formed to be greater than an interval between the both ends of the magnetic material core (the height of the gap portion) in the bus bar for current detection, the magnetic material core cannot be subsequently attached to the bus bar for current detection formed as a part of the previously-installed bus bar. In this case, if a coupling portion to the other bus bar is formed in the second portion, it is easy to subsequently couple, to the previously-installed bus bar, the bus bar for current detection in a penetrating state through the hollow portion of the magnetic material core.

Moreover, in the current detection device according to the present invention, if the magnetic material core, the bus bar for current detection, and the magneto-electric converting element are held in a predetermined positional relationship by means of the insulation housing covering portions other than the portion to be exposed, it is easy to carry out an operation for attaching the current detection device to the previously-installed bus bar.

Moreover, according to the method for producing a current detection device according to the present invention, it is possible to easily fabricate a bus bar for current detection in which the width (diameter) of the section of the tubular first portion is greater than the height of the gap portion in the magnetic material core.

EMBODIMENT FOR CARRYING OUT THE INVENTION

An embodiment according to the present invention will be described below with reference to the accompanying drawings. The following embodiment is only illustrative for implementing the present invention and is not a case example which restricts the technical scope of the present invention.

Figure 1:
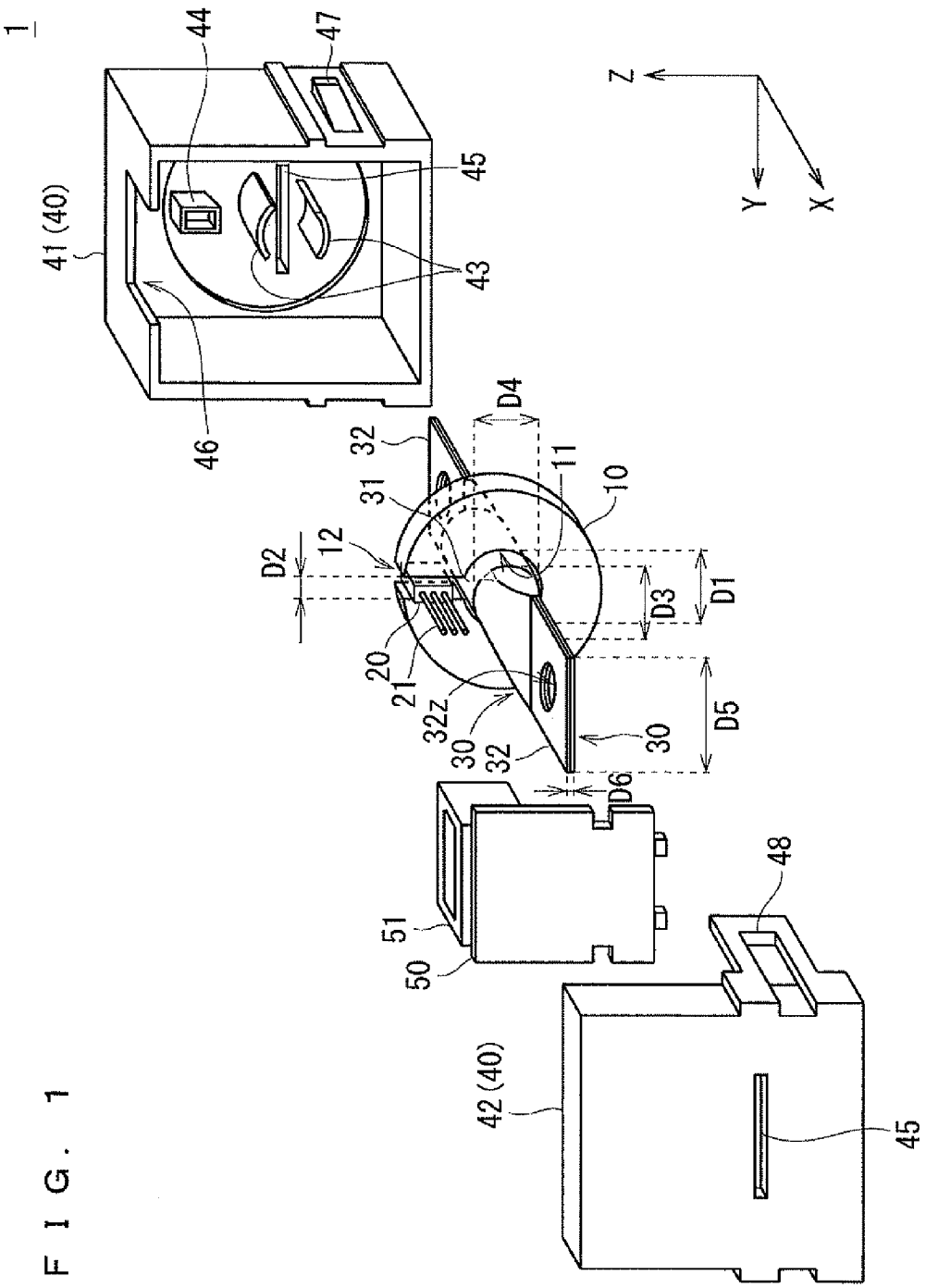
FIG. 1 is an exploded perspective view showing a current detection device 1 according to an embodiment of the present invention.
Figure 2:
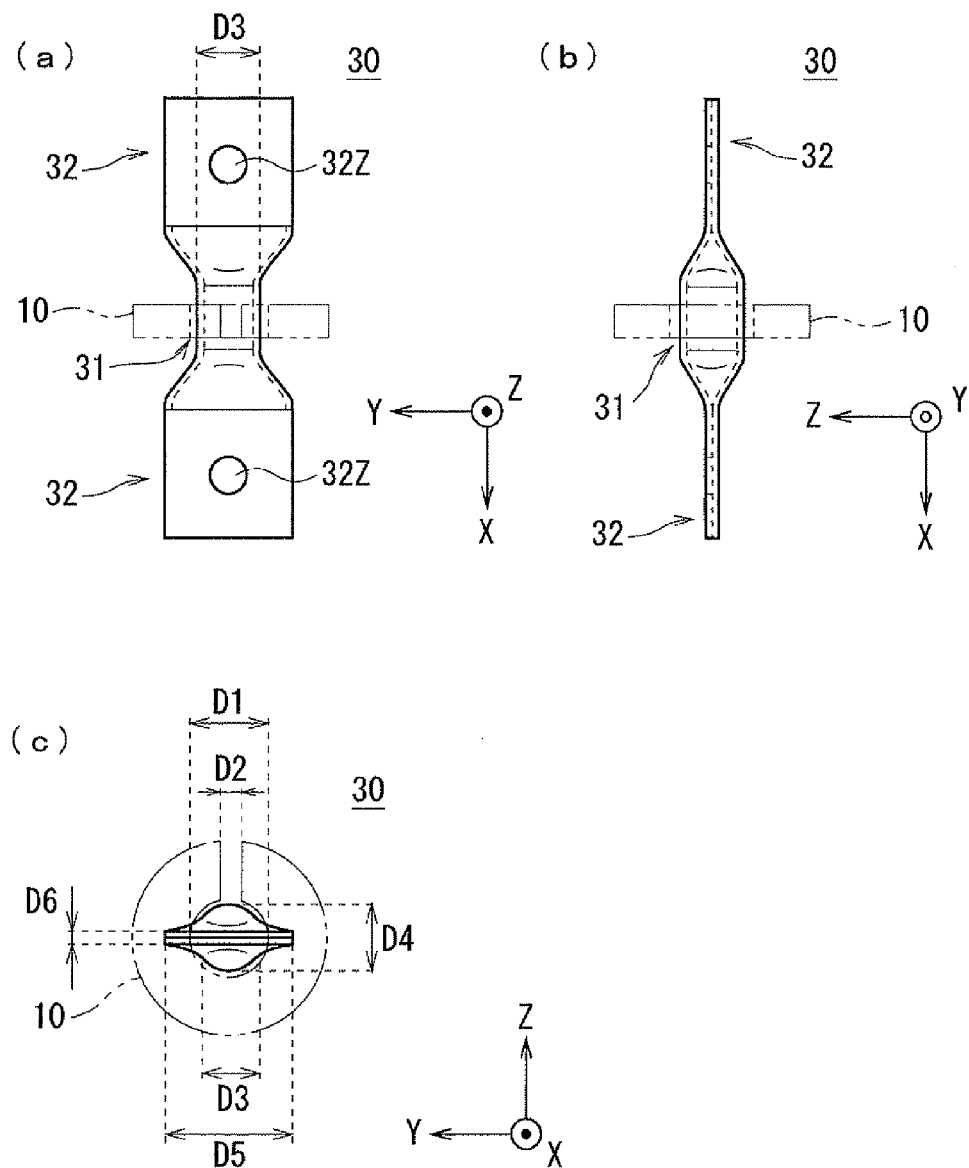
FIG. 2 is a trihedral view showing a bus bar for current detection 30 provided in the current detection device 1.

First, a structure of a current detection device 1 according to the embodiment of the present invention will be described with reference to FIGS. 1 to 4. FIG. 2(a) is a plan view, FIG. 2(b) is a side view, and FIG. 2(c) is a front view. The current detection device 1 detects a current flowing to a bus bar for electrically connecting a battery to a device such as a motor in an electric car or a hybrid car. As shown in FIG. 1, the current detection device 1 includes a magnetic material core 10, a Hall element 20, a bus bar for current detection 30, an insulation housing 40, and an electronic substrate 50.

<Magnetic Material Core>

The magnetic material core 10 is a magnetic body formed of ferrite or silicon steel, and has a shape continuously formed around a hollow portion 11 with both ends opposed to each other across a gap portion 12 having a size of approximately several millimeters. In other words, although the magnetic material core 10 has the narrow gap portion 12, it is formed substantially annular. The magnetic material core 10 according to the present embodiment is formed in an annular shape surrounding the circular hollow portion 11.

<Hall Element (Magneto-Electric Converting Element)>

The Hall element 20 is an example of a magneto-electric converting element which is disposed in the gap portion 12 of the magnetic material core 10 and which detects a magnetic flux to be varied depending on a current passing through the hollow portion 11 of the magnetic material core 10 and outputs a magnetic flux detection signal as an electric signal.

<Electronic Substrate>

The electronic substrate 50 is a substrate on which a circuit to be connected to a terminal 21 of the Hall element 20 and a connector 51 for connecting the same circuit to the other external circuit are mounted. Accordingly, the connector 51 is electrically connected to the Hall element 20. The circuit mounted on the electronic substrate 50 is a circuit for amplifying the magnetic flux detection signal output from the Hall element 20, for example. The Hall element 20 is connected to an external circuit through the electronic substrate 50 including the connector 51.

<Bus Bar for Current Detection>

The bus bar for current detection 30 is an electric conductor formed by metal such as copper and forms a part of a bus bar for electrically connecting a battery to an electrical device. This means that a current to be detected flows to the bus bar for current detection 30. Moreover, the bus bar for current detection 30 is a member independent of a bus bar on a battery side that is previously connected to the battery and a bus bar on a device side which is previously connected to the electrical device. The bus bar for current detection 30 has both ends connected to other previously-installed bus bars (the bus bar on the battery side and the bus bar on the device side).

As shown in FIGS. 1 and 2, the bus bar for current detection 30 is substantially configured by a first portion 31 occupying a certain range in a central part and second portions 32 on both sides thereof. The first portion 31 penetrates through the hollow portion 11 of the magnetic material core 10 in a current passing direction. The current passing direction indicates a thickness direction of the magnetic material core 10, and an axial center direction of a cylinder in the case of regarding the annular magnetic material core 10 as the cylinder, and furthermore, an orthogonal direction to a surface formed by the annular magnetic material core 10. In each of the figures, the current passing direction is indicated as an X-axis direction. In the following description, the current passing direction (the X-axis direction) will be referred to as a first direction.

The bus bar for current detection 30 is a member formed by a conductor provided with the first portion 31 penetrating through the hollow portion 11 of the magnetic material core 10 in the first direction and the plate-shaped second portions 32 each linked to both sides in the first direction with respect to the first portion 31. Moreover, the first portion 31 in the bus bar for current detection 30 is formed in a tubular shape, for example, a circular cylindrical shape, an elliptical cylindrical shape, or the like. In each figure, a width direction and a thickness direction of the plate-shaped second portion 32 are indicated as a Y-axis direction and a Z-axis direction, respectively. In the following description, the width direction (the Y-axis direction) and the thickness direction (the Z-axis direction) of the plate-shaped second portion 32 will be referred to as a second direction and a third direction, respectively.

Figure 3:
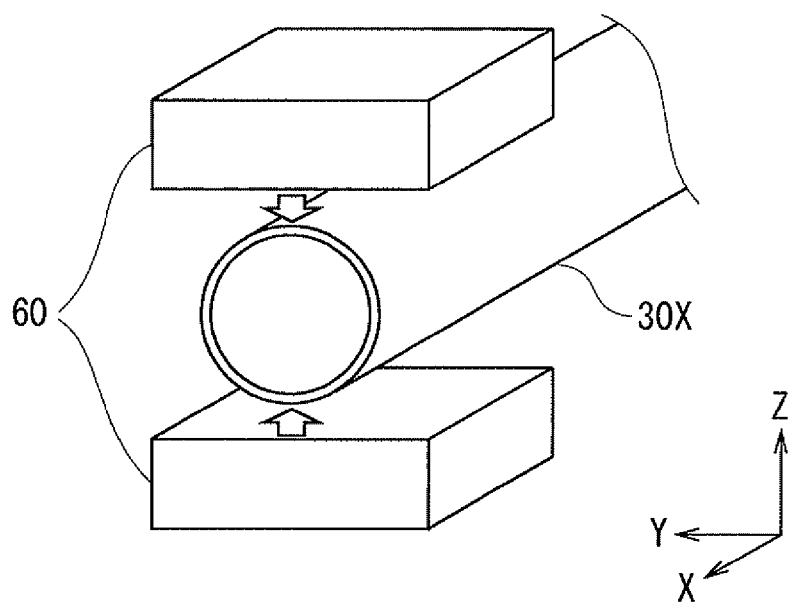
FIG. 3 is a perspective view schematically showing a process for producing the bus bar for current detection 30.

FIG. 3 is a perspective view schematically showing a process for producing the bus bar for current detection 30. The bus bar for current detection 30 is a member having a structure in which parts occupying certain ranges on both ends of a tubular metal member 30X are crushed into a plate shape by means of a pressing machine 60 or the like. In this case, at least one of the both ends of the tubular metal member 30X is pressed into the plate shape after the tubular metal member 30X is inserted into the hollow portion 11 of the magnetic material core 10.

More specifically, in a process for producing the current detection device 1, the process for producing the bus bar for current detection 30 is performed in accordance with the following procedure, for example. [1] First, a penetrating step of causing the tubular metal member 30X to penetrate through the hollow portion 11 of the magnetic material core 10 is performed. [2] Next, a first pressing step of crushing one of the ends of the tubular metal member 30X into the plate shape by means of the pressing machine 60 or the like is performed. [3] Finally, a second pressing step of crushing the other end of the tubular metal member 30X into the plate shape by means of the pressing machine 60 or the like is performed.

In the producing process, it is sufficient that the penetrating step [1] is carried out before one or both of the first pressing step [2] and the second pressing step [3] are performed. For example, the first pressing step [2] may be carried out first, the penetrating step [1] may be subsequently carried out, and the second pressing step [3] may be finally carried out. Moreover, the penetrating step [1] may be carried out first, and the first pressing step [2] and the second pressing step [3] may be subsequently carried out at the same time.

The parts of the both ends which are crushed into the plate shape constitute the second portions 32 of the bus bar for current detection 30, and the tubular part therebetween constitutes the first portion 31 of the bus bar for current detection 30. The plate-shaped second portion 32 formed by crushing the end of the tubular metal member 30X has a structure in which two-layered metal plates are bonded to each other in the thickness direction.

The metal member 30X shown in FIG. 3 is a circular cylindrical member, and the first portion 31 of the bus bar for current detection 30 which is produced by processing the both ends of the metal member 30X has a circular cylindrical shape. It is also supposed that the tubular metal member 30X has an elliptical cylindrical shape or a rectangular cylindrical shape. It is desirable that a sectional shape of the metal member 30X, that is, a contour shape of a section of the first portion 31 be similar to a shape of the hollow portion 11 of the magnetic material core 10.

In the bus bar for current detection 30, a width D5 of the second portion 32 is formed to be greater than a diameter D1 (a maximum width) of the hollow portion 11. Moreover, a minimum width D4 of the contour of the section in the first portion 31 is formed to be greater than a thickness D6 of the second portion 32. In other words, a ratio of a longitudinal dimension and a horizontal dimension of the contour of the section in the first portion 31 approximates to one more greatly than a ratio of a longitudinal dimension and a horizontal dimension of the section in the second portion 32. In the case where the first portion 31 has a shape of a circular cylinder, the minimum width D4 and the maximum width D3 in the contour of the section of the first portion 31 are equal to each other. Moreover, the ratio approximating to one includes a ratio of one.

In the bus bar for current detection 30, furthermore, the minimum width D4 of the contour of the section in the first portion 31 is formed to be greater than a gap height D2 to be an interval between both ends of the magnetic material core 10. In addition, as described above, the width D5 of the second portion 32 is greater than the diameter D1 (the maximum width) of the hollow portion 11 of the magnetic material core 10. For this reason, the magnetic material core 10 cannot be attached to the first portion 31 of the previously-produced bus bar for current detection 30. Accordingly, a set of the magnetic material core 10 and the bus bar for current detection 30 in a penetrating state through the hollow portion 11 of the magnetic material core 10 is fabricated, and the bus bar for current detection 30 is then connected to the other bus bar.

Figure 5:
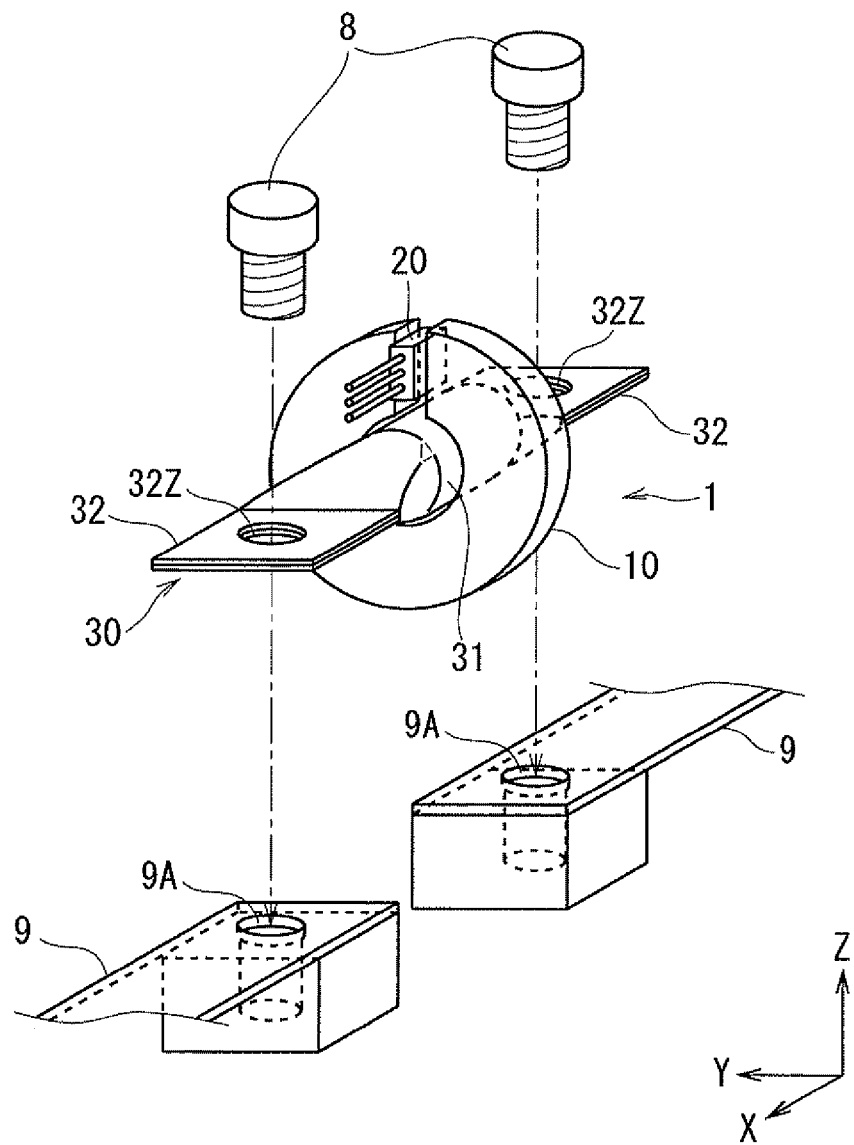
FIG. 5 is a perspective view schematically showing a state in which the current detection device 1 is coupled to a previously-installed bus bar.

Therefore, a hole 32Z for screw fastening is formed as a coupling portion to the other bus bar on the second portion 32 of the bus bar for current detection 30. FIG. 5 is a perspective view schematically showing a state in which the second portion 32 of the bus bar for current detection 30 in the current detection device 1 is coupled, with a screw 8, to the other previously-installed bus bar 9. In FIG. 5, for convenience, the insulation housing 40 is not shown. As shown in FIG. 5, a portion in the other bus bar 9 which is to be coupled to the second portion 32 of the bus bar for current detection 30 has a structure as a terminal block, for example, and a hole 9A for screw fastening is formed thereon. It is also supposed that the coupling portion provided on the second portion 32 has the other structure such as a fitting mechanism with the other bus bar 9 in addition to the screw fastening hole 32Z.

<Insulation Housing>

The insulation housing 40 is constituted by an insulator and is a member holding the magnetic material core 10, the Hall element 20, the bus bar for current detection 30, and the electronic substrate 50, and includes a main body case 41 and a cover member 42 to be attached to the main body case 41. Each of the main body case 41 and the cover member 42 is an integrally molded member constituted by an insulating resin, for example, polyamide (PA), polypropylene (PP), polybutylene terephthalate (PBT), an ABS resin, or the like.

The main body case 41 is formed in a shape of a box having an opening, and the cover member 42 is attached to the main body case 41, thereby closing the opening of the main body case 41. A first holding portion 43 and a second holding portion 44 which are protruded from a surface on an inside of the main body case 41 are formed. The main body case 41 holds the magnetic material core 10, the bus bar for current detection 30 penetrating through the hollow portion 11, and the Hall element 20 disposed in the gap portion 12 by means of the first holding portion 43 and the second holding portion 44 in a state not making contact with each other.

More specifically, the first holding portion 43 is fitted in a clearance between the magnetic material core 10 and the first portion 31 of the bus bar for current detection 30 penetrating through the hollow portion 11, thereby holding the magnetic material core 10 and the bus bar for current detection 30 in a state not making contact with each other. Moreover, the second holding portion 44 is fitted in a clearance between the magnetic material core 10 and the Hall element 20 disposed in the gap portion 12, thereby holding the magnetic material core 10 and the Hall element 20 in a state not making contact with each other.

Moreover, a slit hole 45 into which the second portions 32 provided on each of both ends of the bus bar 30 for current detection are inserted is formed on the main body case 41 and the cover member 42. In a state in which one of the second portions 32 in the bus bar for current detection 30 penetrating through the hollow portion 11 of the magnetic material core 10 is inserted through the slit hole 45 of the main body case 41, the first holding portion 43 and the second holding portion 44 in the main body case 41 hold the magnetic material core 10, the Hall element 20, and the bus bar for current detection 30.

Moreover, the cover member 42 is attached to the main body case 41 holding the magnetic material core 10, the Hall element 20, and the bus bar for current detection 30 in order to close the opening of the main body case 41 while interposing the electronic substrate 50 therebetween. In this case, the other second portion 32 in the bus bar for current detection 30 is inserted into the slit hole 45 of the cover member 42 from the inside toward the outside. Moreover, the electronic substrate 50 is sandwiched between the main body case 41 and the cover member 42, and the connector 51 mounted on the electronic substrate 50 is thereby held in a fitting state in a cut-out portion 46 formed on the main body case 41.

Furthermore, the main body case 41 and the cover member 42 are provided with locking mechanisms 47 and 48 for holding the main body case 41 and the cover member 42 in a combined state. The locking mechanisms 47 and 48 shown in FIG. 1 include a claw portion 47 protrudingly formed from a side surface of the main body case 41 and an annular frame portion 48 formed on a side of the cover member 42. The claw portion 47 of the main body case 41 is fitted in a hole formed by the frame portion 48 of the cover member 42 so that the main body case 41 and the cover member 42 are held in a state combined with each other.

Figure 4:
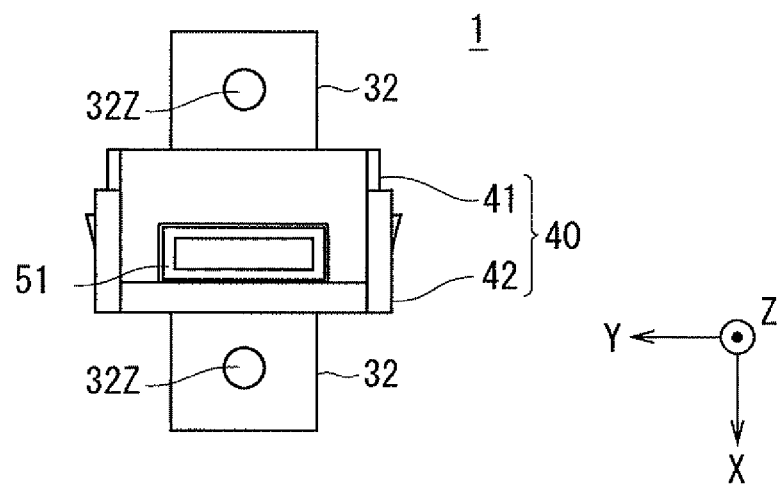
FIG. 4 is a plan view showing the current detection device 1.

FIG. 4 is a plan view showing the current detection device 1 in the state in which the main body case 41 and the cover member 42 are combined with each other. As shown in FIG. 4, the main body case 41 and the cover member 42 (the insulation housing 40) cover and hold the magnetic material core 10, the first portion 31 of the bus bar for current detection 30 and the Hall element 20 in a state in which a portion (a coupling portion) provided with the hole 32Z in the second portion 32 of the bus bar for current detection 30 and the connector 51 of the electronic substrate 50 are exposed toward the outside.

In the bus bar for current detection 30 of the current detection device 1 described above, the first portion 31 is formed such that the maximum width D3 of the contour of the section is smaller than the width D5 (the maximum width) of the second portion. In other words, the contour shape of the section of the first portion 31 is constricted in the second direction with respect to the second portion 32. As a result, in the current detection device 1, it is possible to employ the comparatively small magnetic material core 10 in a relationship with the width of the bus bar, and thus, it is possible to avoid an increase in size of the whole device including the magnetic material core 10.

Furthermore, in the bus bar for current detection 30, the contour shape of the section of the first portion 31 is formed such that the minimum width D4 is greater than the thickness D6 (the minimum width) of the second portion 32. Consequently, the sectional area of the conductor in the first portion 31 is not considerably reduced as compared with the sectional area of the conductor in the second portion 32. Particularly, in the bus bar for current detection 30 having a structure in which both ends of the tubular metal member 30X are crushed into the plate shape, the sectional area of the conductor in the first portion 31 is equal to the sectional area of the conductor in the second portion 32. Accordingly, it is possible to prevent excessive heat generation in the first portion 31. Since the second portion 32 is a portion where a whole heat capacity is increased together with the coupling screw 8 and the other bus bar 9 which are to be welded thereto by pressure, no problem of the heat generation is caused by the presence of the hole 32Z.

Moreover, in the bus bar for current detection 30 having the structure in which the both end portions of the tubular metal member 30X are crushed into the plate shape, it is possible to fabricate the plate-shaped second portion 32 having a greater width than the width D1 of the hollow portion 11 after inserting the tubular metal member 30X into the hollow portion 11 of the magnetic material core 10. Accordingly, it is possible to easily fabricate the bus bar for current detection 30 in which the width D3 (the diameter) of the section of the tubular first portion 31 is formed to be greater than the gap height D2 in the magnetic material core 10. In order to enhance the detection sensitivity of a current, it is desirable to decrease the gap height D2, thereby reducing a clearance between the Hall element 20 disposed in the gap portion 12 and the both ends of the magnetic material core 10.

Moreover, in the current detection device 1, the magnetic material core 10, the Hall element 20, and the bus bar for current detection 30 are held in a predetermined positional relationship by the insulation housing 40 covering parts other than the hole 32Z of the second portion 32 and the connector 51 which are to be exposed. Consequently, it is easy to carry out an operation for attaching the current detection device 1 to the previously-installed bus bar 9.

<Bus Bar for Current Detection (First Application Example)>

Figure 6:
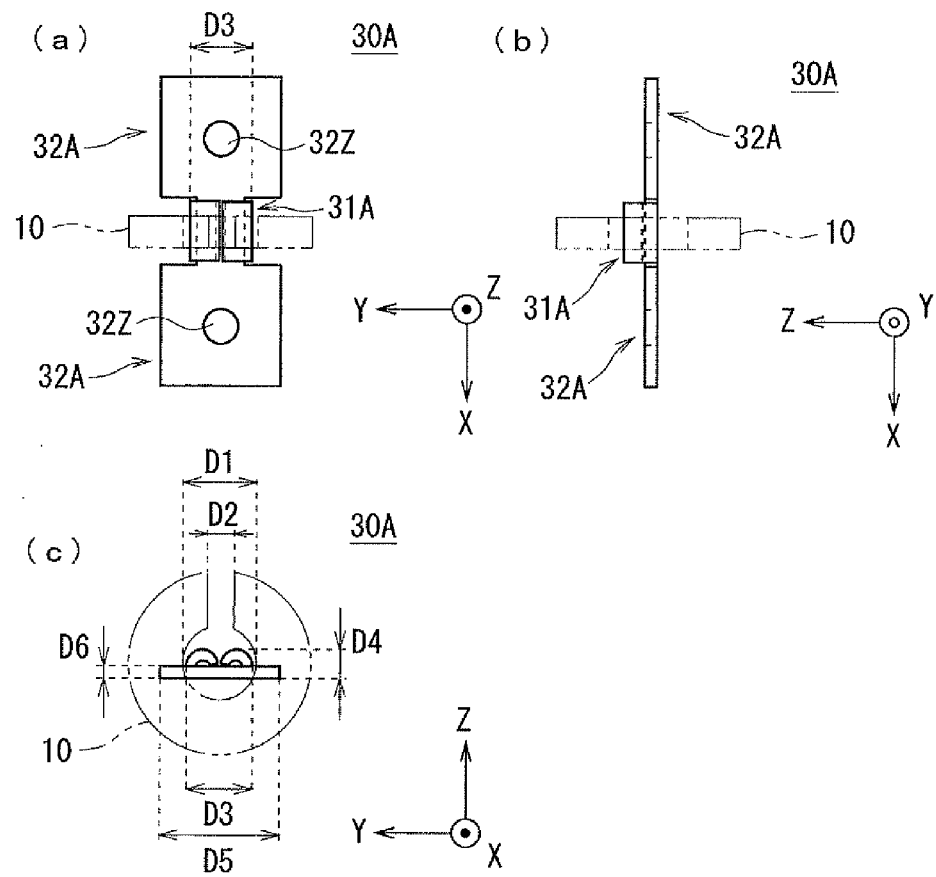
FIG. 6 is a trihedral view showing a bus bar for current detection 30A according to a first application example which can be employed for the current detection device 1.
Figure 7:
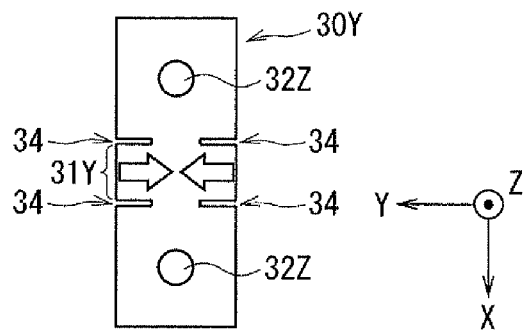
FIG. 7 is a plan view showing a member which is an origin of the bus bar for current detection 30A.

Next, a bus bar for current detection 30A according to a first application example which can be employed for the current detection device 1 will be described with reference to FIGS. 6 and 7. FIG. 6 is a trihedral view showing the bus bar for current detection 30A. Moreover, FIG. 7 is a plan view showing a plate-shaped metal member 30Y which is an origin of the bus bar for current detection 30A. In FIG. 6, a magnetic material core 10 to be combined with the bus bar for current detection 30A is shown with a virtual line (a two-dot chain line). Furthermore, FIG. 6($a$) is a plan view, FIG. 6($b$) is a side view, and FIG. 6($c$) is a front view.

In FIGS. 6 and 7, the same components as those shown in FIGS. 1 to 5 have the same reference numerals. Hereinafter, description will be given to only a difference of the bus bar for current detection 30A from the bus bar for current detection 30.

Similarly to the bus bar for current detection 30, the bus bar for current detection 30A is also a member constituted by a conductor provided with a first portion 31A penetrating through a hollow portion 11 of a magnetic material core 10 in a first direction (an X-axis direction) and plate-shaped second portions 32A each linked to both sides in the first direction with respect to the first portion 31A.

Also in the bus bar for current detection 30A, a width D5 of the second portion 32A is formed to be greater than a diameter D1 (a maximum width) of the hollow portion 11. Moreover, a minimum width D4 of a contour of a section in the first portion 31A is formed to be greater than a thickness D6 of the second portion 32A.

On the other hand, in the bus bar for current detection 30A, the minimum width D4 of the contour of the section in the first portion 31A is formed to be smaller than a gap height D2 which is an interval between both ends of the magnetic material core 10. For this reason, it is possible to attach the magnetic material core 10, through a gap portion 12, to the first portion 31A of the previously-produced bus bar for current detection 30A.

The bus bar for current detection 30A is a member having a structure in which a portion 31Y in the plate-shaped metal member 30Y is folded back from both sides in a second direction (a Y-axis direction) along cuts 34 formed on both sides in the first direction (the X-axis direction) of the portion 31Y. The cuts 34 in the metal member 30Y are formed inward from both ends in the second direction (the Y-axis direction) at both sides in the first direction (the X-axis direction) of the portion 31Y. Then, the fold-back portion 31Y constitutes the first portion 31A of the bus bar for current detection 30A, and parts at both sides of the fold-back portion 31Y constitute the second portions 32A. It is easy to fabricate such a bus bar for current detection 30A.

Also in the bus bar for current detection 30A, the contour shape of the section of the first portion 31A is constricted in the second direction (the Y-axis direction) with respect to the second portion 32A. As a result, in the current detection device 1, it is possible to employ the comparatively small magnetic material core 10 in a relationship with the width of the bus bar also in the case where the bus bar for current detection 30A is employed, and thus, it is possible to prevent an increase in size of the whole device including the magnetic material core 10.

Furthermore, in the bus bar for current detection 30A, the contour shape of the section of the first portion 31A is formed such that the minimum width D4 is greater than the thickness D6 (the minimum width) of the second portion 32A. Consequently, the sectional area of the conductor in the first portion 31A is not considerably reduced as compared with the sectional area of the conductor in the second portion 32A. Particularly, in the bus bar for current detection 30A having a structure in which a part of the plate-shaped metal member 30Y is folded back, the sectional area of the conductor in the first portion 31A is equal to the sectional area of the conductor in the second portion 32A.

In the bus bar for current detection 30A, referring to the part in which the cut 34 is formed between the first portion 31A and the second portion 32A, the sectional area of the conductor is smaller than the sectional area of the conductor in the part provided therebefore and thereafter. As a result of an experiment, however, in the case where the width of the cut 34 is very small, it is apparent that an increase in impedance in the part provided with the cut 34 is so small as to be almost disregarded for the whole bus bar for current detection 30A. Therefore, in the bus bar for current detection 30A, it is possible to prevent excessive heat generation in the first portion 31 in the case where the cut 34 having a very small width is formed.

<Bus Bar for Current Detection (Second Application Example)>

Figure 8:
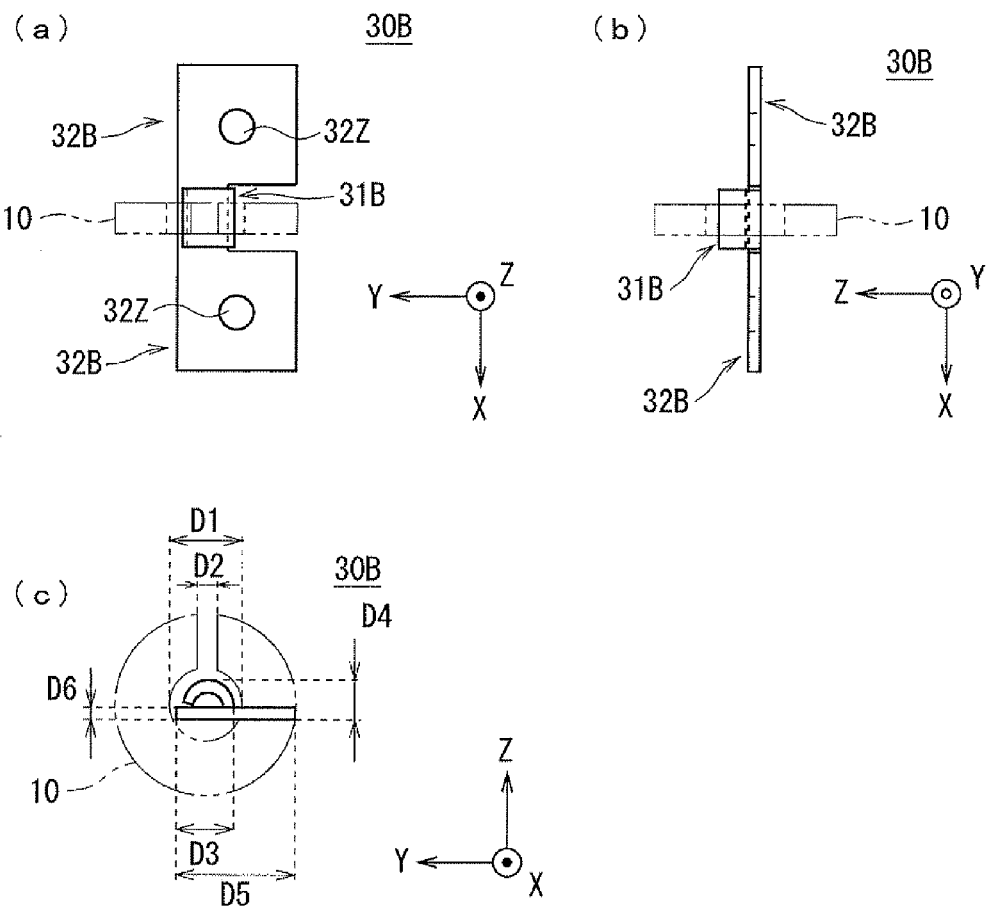
FIG. 8 is a trihedral view showing a bus bar for current detection 30B according to a second application example which can be employed for the current detection device 1.
Figure 9:
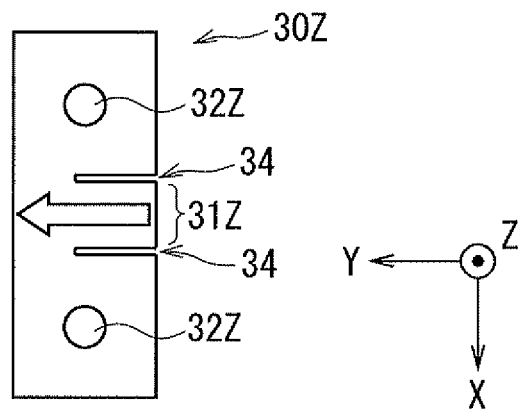
FIG. 9 is a plan view showing a member which is an origin of the bus bar for current detection 30B.
Figure 10:
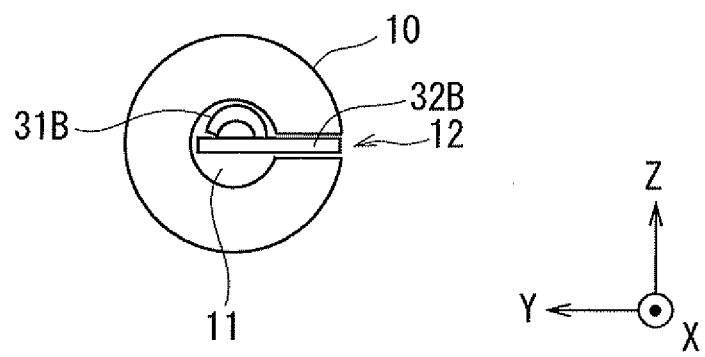
FIG. 10 is a view showing a state in which the bus bar for current detection 30B is inserted into a hollow portion of a magnetic material core.

Next, a bus bar for current detection 30B according to a second application example which can be employed for the current detection device 1 will be described with reference to FIGS. 8 to 10. FIG. 8 is a trihedral view showing the bus bar for current detection 30B. Moreover, FIG. 9 is a plan view showing a plate-shaped metal member 30Z which is an origin of the bus bar for current detection 30B. Furthermore, FIG. 10 is a view showing a state in which the bus bar for current detection 30B is inserted into a hollow portion 11 of a magnetic material core 10. In FIG. 8, the magnetic material core 10 to be combined with the bus bar for current detection 30B is shown in a virtual line (a two-dot chain line). Furthermore, FIG. 8(*a*) is a plan view, FIG. 8(*b*) is a side view, and FIG. 8(*c*) is a front view.

In FIGS. 8 to 10, the same components as those shown in FIGS. 1 to 5 have the same reference numerals. Hereinafter, description will be given to only a difference of the bus bar for current detection 30B from the bus bar for current detection 30.

Similarly to the bus bar for current detection 30, the bus bar for current detection 30B is also a member constituted by a conductor provided with a first portion 31B penetrating through a hollow portion 11 of a magnetic material core 10 in a first direction (an X-axis direction) and plate-shaped second portions 32B each linked to both sides in the first direction with respect to the first portion 31B.

Also in the bus bar for current detection 30B, a width D5 of the second portion 32B is formed to be greater than a diameter D1 (a maximum width) of the hollow portion 11. Moreover, a minimum width D4 of a contour of a section in the first portion 31B is formed to be greater than a thickness D6 of the second portion 32B.

The bus bar for current detection 30B is a member having a structure in which a portion 31Z in the plate-shaped metal member 30Z is folded back from one side in a second direction (a Y-axis direction) along cuts 34 formed on both sides in the first direction (the X-axis direction) of the portion 31Z. The cuts 34 in the metal member 30Z are formed inward from one of ends in the second direction (the Y-axis direction) at both sides in the first direction (the X-axis direction) of the portion 31Z. Then, the fold-back portion 31Z constitutes the first portion 31B of the bus bar for current detection 30B, and parts at both sides of the fold-back portion 31Z constitute the second portions 32B. It is also easy to fabricate such a bus bar for current detection 30B.

Moreover, in the bus bar for current detection 30B, the minimum width D4 of the contour of the section in the first portion 31B is formed to be greater than a gap height D2 to be an interval between both ends of the magnetic material core 10. Furthermore, in the bus bar for current detection 30B, the first portion 31B to be the fold-back portion 31Z is formed in a position inclined to a side of one of the ends in the second direction (the Y-axis direction). In the example shown in FIGS. 8 to 10, the first portion 31B is formed in a position inclined to an end in a positive direction of the Y axis.

In the bus bar for current detection 30B having the structure as described above, also in the case where the minimum width D4 of the contour of the section in the first portion 31B is formed to be greater than the gap height D2 of the magnetic material core 10, it is possible to insert the first portion 31B into the hollow portion 11 of the magnetic material core 10.

In other words, as shown in FIG. 10, the bus bar for current detection 30B and the magnetic material core 10 are disposed such that the entire first portion 31B is positioned overlapped with the hollow portion 11 and the second portion 32B is positioned so as to overlap with both the hollow portion 11 and the gap portion 12 and so as not to overlap with the magnetic material core 10 as seen in the first direction (the X-axis direction). By moving the bus bar for current detection 30B or the magnetic material core 10 in the first direction (the X-axis direction) in this state, it is possible to insert the first portion 31B into the hollow portion 11 of the magnetic material core 10. Therefore, it is possible to attach the magnetic material core 10 to the first portion 31B of the previously-produced bus bar for current detection 30B.

DESCRIPTION OF REFERENCE SIGNS

1 current detection device
8 screw
9 other bus bar
10 magnetic material core
11 hollow portion
12 gap portion
20 Hall element
21 terminal
30, 30A, 30B bus bar for current detection
30X, 30Y, 30Z metal member
31, 31A, 3113 first portion
32, 32A, 32B second portion
32Z hole
34 cut
40 insulation housing
41 main body case
42 cover member
43 first holding portion
44 second holding portion
45 slit hole
47 claw portion (locking mechanism)
48 frame portion (locking mechanism)
50 electronic substrate
51 connector

The invention claimed is:

1. A current detection device for detecting a current flowing to a bus bar, comprising:
   a magnetic material core having both ends opposed to each other across a gap portion and continuously formed around a hollow portion;
   a magneto-electric converting element disposed in said gap portion for detecting a magnetic flux to be varied depending on a current passing through said hollow portion; and
   a bus bar for current detection constituted by a conductor provided with a first portion penetrating through said hollow portion of said magnetic material core in a current passing direction and plate-shaped second portions each linked to both sides in said current passing direction with respect to said first portion, the bus bar for current detection being formed such that a width of said second portion is greater than a maximum width of said hollow portion and a minimum width of a contour of a section in said first portion is greater than a thickness of said second portion,
   wherein said bus bar for current detection is a member having a structure in which a part of a plate-shaped metal member is folded back along cuts formed on both sides thereof, a fold-back portion constitutes said first portion and portions on both sides of said fold-back portion constitute said second portion.

2. The current detection device according to claim 1, wherein said fold-back portion is formed in a position inclined to a side of one of ends in a width direction of said second portion in said bus bar for current detection.

3. A current detection device for detecting a current flowing to a bus bar, comprising:
- a magnetic material core having both ends opposed to each other across a gap portion and continuously formed around a hollow portion;
- a magneto-electric converting element disposed in said gap portion for detecting a magnetic flux to be varied depending on a current passing through said hollow portion; and
- a bus bar for current detection constituted by a conductor provided with a first portion penetrating through said hollow portion of said magnetic material core in a current passing direction and plate-shaped second portions each linked to both sides in said current passing direction with respect to said first portion, the bus bar for current detection being formed such that a width of said second portion is greater than a maximum width of said hollow portion and a minimum width of a contour of a section in said first portion is greater than a thickness of said second portion, wherein in said bus bar for current detection,
- the minimum width of the contour of the section in said first portion is formed greater than an interval between both ends of said magnetic material core, and
- a coupling portion to another bus bar is formed in said second portion.

4. The current detection device according to claim 3, further comprising an insulation housing constituted by an insulator and covering said magnetic material core, said first portion of said bus bar for current detection, and said magneto-electric converting element in a state in which said coupling portion of said bus bar for current detection and a connector electrically connected to said magneto-electric converting element are exposed to an outside, and holding said magnetic material core, said bus bar for current detection penetrating through said hollow portion, and said magneto-electric converting element disposed in said gap portion in a state not making contact with each other.

* * * * *